(12) United States Patent
Hsieh et al.

(10) Patent No.: US 10,663,633 B2
(45) Date of Patent: May 26, 2020

(54) APERTURE DESIGN AND METHODS THEREOF

(71) Applicant: Taiwan Semiconductor Manufacturing Co., Ltd., Hsinchu (TW)

(72) Inventors: Hung-Chih Hsieh, Hsinchu (TW); Kai Wu, Hsinchu (TW); Yen-Liang Chen, Hsinchu County (TW); Kai-Hsiung Chen, New Taipei (TW); Po-Chung Cheng, Chiayi County (TW); Chih-Ming Ke, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 280 days.

(21) Appl. No.: 15/637,910

(22) Filed: Jun. 29, 2017

(65) Prior Publication Data

US 2019/0004220 A1    Jan. 3, 2019

(51) Int. Cl.
| | | |
|---|---|---|
| *G03F 7/20* | (2006.01) | |
| *G02B 5/18* | (2006.01) | |
| *G02F 1/31* | (2006.01) | |
| *G03H 1/26* | (2006.01) | |
| *G03F 1/44* | (2012.01) | |

(52) U.S. Cl.
CPC ............ *G02B 5/1866* (2013.01); *G02B 5/18* (2013.01); *G02F 1/31* (2013.01); *G03F 1/44* (2013.01); *G03F 7/2024* (2013.01); *G03F 7/70616* (2013.01); *G03F 7/70633* (2013.01); *G03H 1/26* (2013.01); *G02B 5/1861* (2013.01)

(58) Field of Classification Search
CPC ...... G02B 5/1866; G02B 5/18; G02B 5/1861; G02F 1/31; G03F 1/44; G03F 7/2024; G03F 7/70633; G03H 1/26
USPC .................................................. 356/399–401
See application file for complete search history.

(56) References Cited

U.S. PATENT DOCUMENTS

| | | | |
|---|---|---|---|
| 8,716,841 | B1 | 5/2014 | Chang et al. |
| 8,736,084 | B2 | 5/2014 | Cheng et al. |
| 8,796,666 | B1 | 8/2014 | Huang et al. |
| 8,837,810 | B2 | 9/2014 | Chen et al. |
| 9,093,530 | B2 | 4/2015 | Huang et al. |
| 9,134,633 | B2 | 9/2015 | Lin et al. |
| 9,230,867 | B2 | 1/2016 | Cheng et al. |
| 9,304,403 | B2 | 4/2016 | Lin et al. |

(Continued)

*Primary Examiner* — Isiaka O Akanbi
(74) *Attorney, Agent, or Firm* — Haynes and Boone, LLP

(57) ABSTRACT

A method for performing DBO measurements utilizing apertures having a single pole includes using a first aperture plate to measure X-axis diffraction of a composite grating. In some embodiments, the first aperture plate has a first pair of radiation-transmitting regions disposed along a first diametrical axis and on opposite sides of an optical axis that is aligned with a center of the first aperture plate. Thereafter, in some embodiments, a second aperture plate, which is complementary to the first aperture plate, is used to measure Y-axis diffraction of the composite grating. By way of example, the second aperture plate has a second pair of radiation-transmitting regions disposed along a second diametrical axis and on opposite sides of the optical axis. In some cases, the second diametrical axis is substantially perpendicular to the first diametrical axis.

20 Claims, 5 Drawing Sheets

(56) References Cited

U.S. PATENT DOCUMENTS

| | | |
|---|---|---|
| 9,404,743 B2 | 8/2016 | Chiu et al. |
| 9,548,303 B2 | 1/2017 | Lee et al. |
| 2012/0123581 A1* | 5/2012 | Smilde ................ G03F 7/70483 700/105 |
| 2015/0346605 A1* | 12/2015 | Den Boef ............... G03F 7/705 438/401 |
| 2016/0061589 A1* | 3/2016 | Bhattacharyya ....... G01B 11/14 356/620 |

* cited by examiner

APERTURE DESIGN AND METHODS THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Throughout a fabrication process, such patterns may be periodically measured in order to maintain a high degree of overlay control (e.g., pattern-to-pattern alignment). With the continued scaling of IC dimensions, coupled with new patterning techniques (e.g., such as double patterning), accurate overlay control is more critical than ever. As such, there is a great deal of interest in metrology tools and techniques capable of accurately measuring these extremely scaled patterns. In at least some existing methods, a signal corresponding to a main pattern feature may be impacted by a signal from a neighboring pattern (e.g., due to tight pattern pitch). Furthermore, signal crosstalk (e.g., along different planes) may also detrimentally effect pattern measurement.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
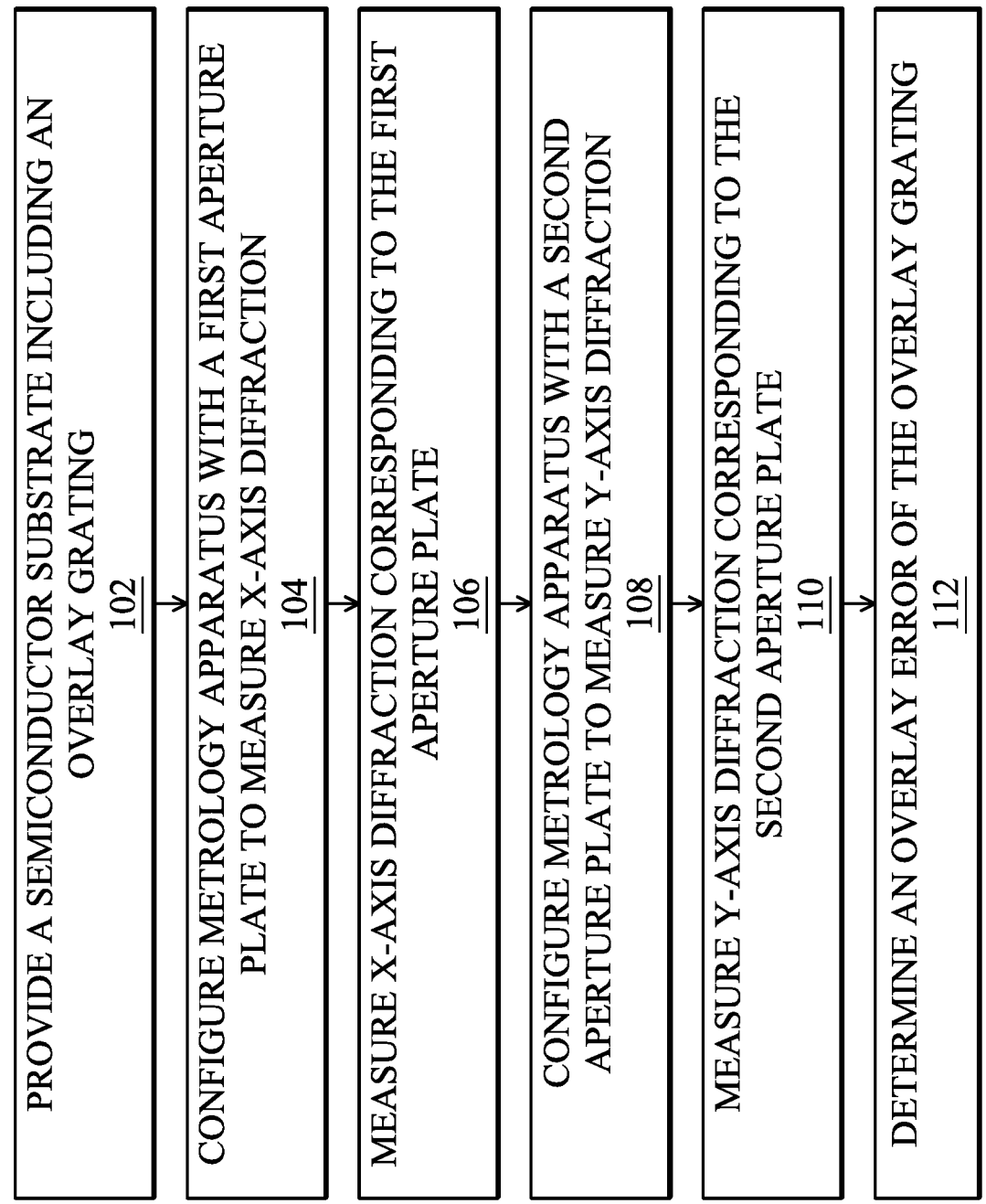
FIG. 1 is a flow chart of a method for performing diffraction pattern measurements, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as an EUV mask.

During a semiconductor lithography process, lithographic templates (e.g., photomasks or reticles) are used to optically transfer patterns onto a substrate. Throughout a fabrication process, such patterns may be periodically measured in order to maintain a high degree of overlay control (e.g., pattern-to-pattern alignment). With the continued scaling of IC dimensions, coupled with new patterning techniques (e.g., such as double patterning), accurate overlay control is more critical than ever. As such, there is a great deal of interest in metrology tools and techniques capable of accurately measuring these extremely scaled patterns. At least some particularly promising techniques for measurement of overlay error are diffraction-based and may be generally referred to as diffraction-based overlay (DBO) methods. As an example of a DBO method, a first grating (e.g., periodic pattern) may be formed in a first layer of a semiconductor substrate, and a second grating may be formed in a second layer over the first layer. In some cases, the second layer may include a resist layer. In various examples, a pitch of the first and second gratings may be substantially the same, and the second grating may be nominally aligned to be on top of the first grating. By measuring the intensity of a diffraction pattern generated by the stacked first and second gratings, a measure of the overlay error may be obtained. Stated another way, if there is some overlay error present between the first and second gratings, it will be detectable via the measured diffraction pattern. In at least some existing grating designs that include a segment type grating, a segment pitch may have a value similar to that of a segment size. As such, in some cases, a signal corresponding to a main pattern feature (e.g., a segment) may be impacted by a signal from a neighboring pattern (e.g., due to tight pattern pitch). The problem may be particularly pronounced due to signal crosstalk, for example, that can occur during simultaneous measurement of X- and Y-plane diffraction patterns. Thus, existing overlay error measurement techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments of the present disclosure provide a method for performing DBO measurements utilizing apertures having a single pole (e.g., also known as "monopole") for diffraction pattern measurement. In some embodiments, a single pole 'X' aperture plate is provided for collection of diffraction patterns along an X-axis, and a single pole 'Y' aperture plate is provided for collection of diffraction patterns along a Y-axis. In some embodiments, the single pole 'X' and 'Y' aperture plates may be used exclusively for diffraction pattern measurement. However, in some cases, the single pole 'X' and 'Y' aperture plates may be used in sequence with an 'X-Y' aperture plate that is designed to simultaneously collect diffraction patterns along both the X-axis and the Y-axis. By employing the single pole 'X' and 'Y' aperture plates, as disclosed herein, X-axis and Y-axis diffraction data may be reliably collected, while mitigating signal crosstalk. As a result, embodiments of the present disclosure provide for better target design tolerance without having a limitation on segment pitch. In addition, in various embodiments, multiple overlay trees may be in the same location (e.g., stacked) without having to shield the gratings. Those skilled in the art will recognize other benefits and advantages of the methods and devices as described herein, and the embodiments described are not meant to be limiting beyond what is specifically recited in the claims that follow.

Referring now to FIG. 1, illustrated therein is a flow chart of a simplified method 100 for performing diffraction pattern measurements (e.g., such as DBO measurements), according to one or more aspects of the present disclosure. It is noted that the process steps of the method 100, including any descriptions given with reference to FIGS. 2A, 2B, 2C, 3, 4A, 4B, 4C, and 5, are merely exemplary and are not intended to be limiting beyond what is specifically recited in the claims that follow.

The method 100 begins at block 102 where a semiconductor substrate including an overlay grating is provided. In some embodiments, the substrate may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof.

Figure 2:
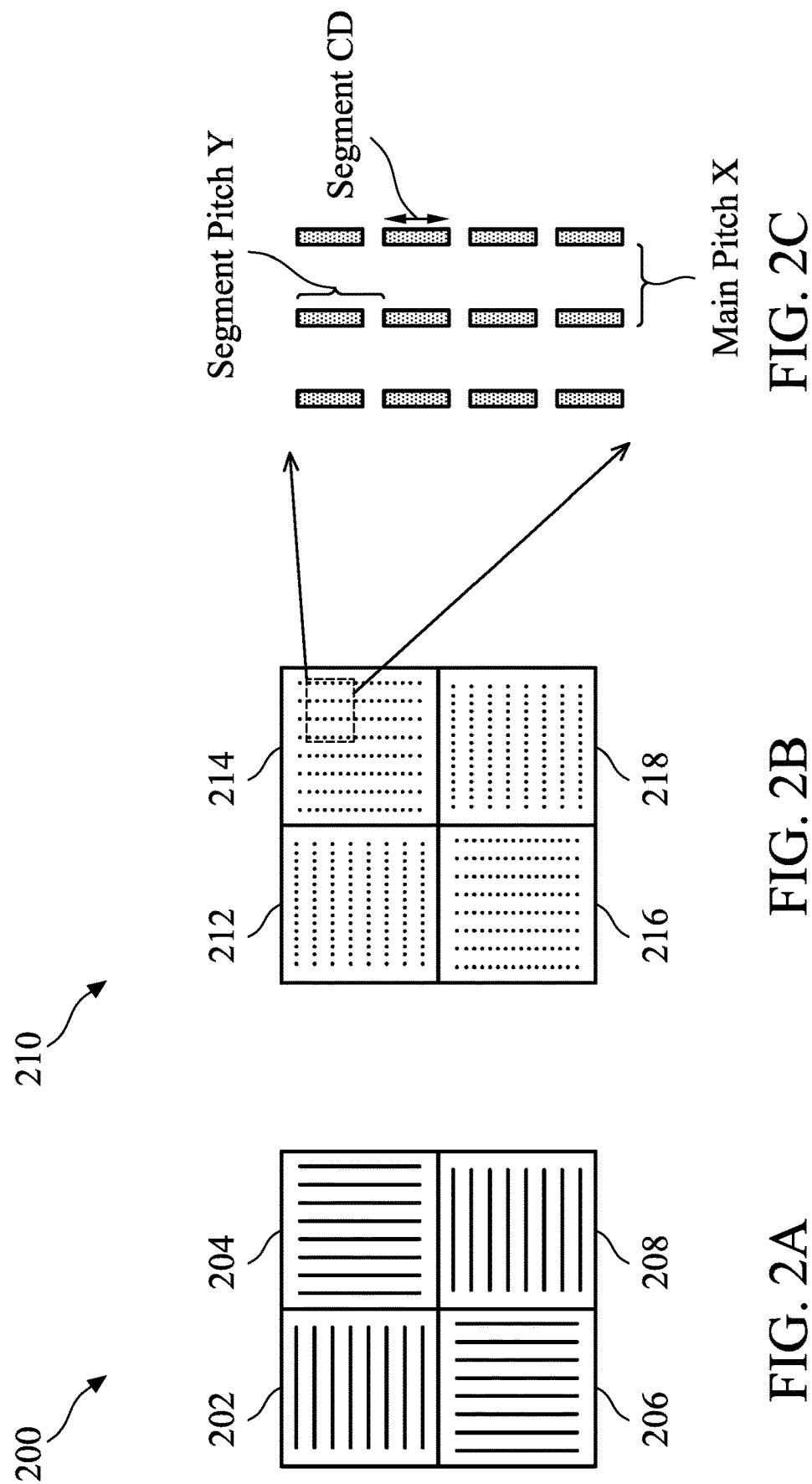
FIGS. 2A and 2B illustrate a composite line-type grating and a composite segment-type grating, respectively, in accordance with some embodiments.
FIG. 2C provides an enlarged view of a portion of the grating of FIG. 2B that illustrates segment size and spacing measurements, in accordance with some embodiments.

In some embodiments, the overlay grating may include the stacked and nominally aligned first and second gratings, as described above. As a further example, and in accordance with some embodiments, FIGS. 2A and 2B illustrate a composite line-type grating 200 and a composite segment-type grating 210, respectively. As shown, the composite line-type grating 200 includes gratings 202, 204, 206, 208, and the composite segment-type grating 210 includes gratings 212, 214, 216, 218. In various embodiments, the four gratings comprising each of the line-type grating 200 and the segment-type grating 210 may be spaced closely together such that all four gratings may be simultaneously imaged by a measurement beam, as discussed below. Moreover, in the case of overlay error measurements, each of the gratings 202, 204, 206, 208 and each of the gratings 212, 214, 216, 218 may themselves be composite gratings that are formed by stacking gratings formed in different layers of a semiconductor substrate and/or a resist layer. Additionally, in some embodiments and in order to facilitate the measurement of overlay error, the various gratings (e.g., 202, 204, 206, 208 212, 214, 216, 218) may be designed to include a specified bias (e.g., with respect to an underlying stacked grating). It is also noted that while each of the composite line-type grating 200 and the composite segment-type grating 210 have been illustrated as including four gratings, some embodiments may include a composite grating matrix having more than four gratings. With reference to the composite segment-type grating 210, FIG. 2C provides an enlarged view of a portion of the grating 214 that illustrates segment size and spacing measurements. In accordance with some embodiments, a segment critical dimension (CD) may be equal to about 330 nm, a segment pitch along the Y-axis (Segment Pitch Y) may be equal to about 500 nm, and a main pitch along the X-axis (Main Pitch X) may be equal to about 600 nm. To be sure, by employing the single pole 'X' and 'Y' aperture plates, as disclosed herein, overlay error may be reliably measured using other segment CD and pitch values. For example, in some cases, the segment CD may be equal to about 130 nm and the Segment Pitch Y may be equal to about 300 nm.

Figure 3:
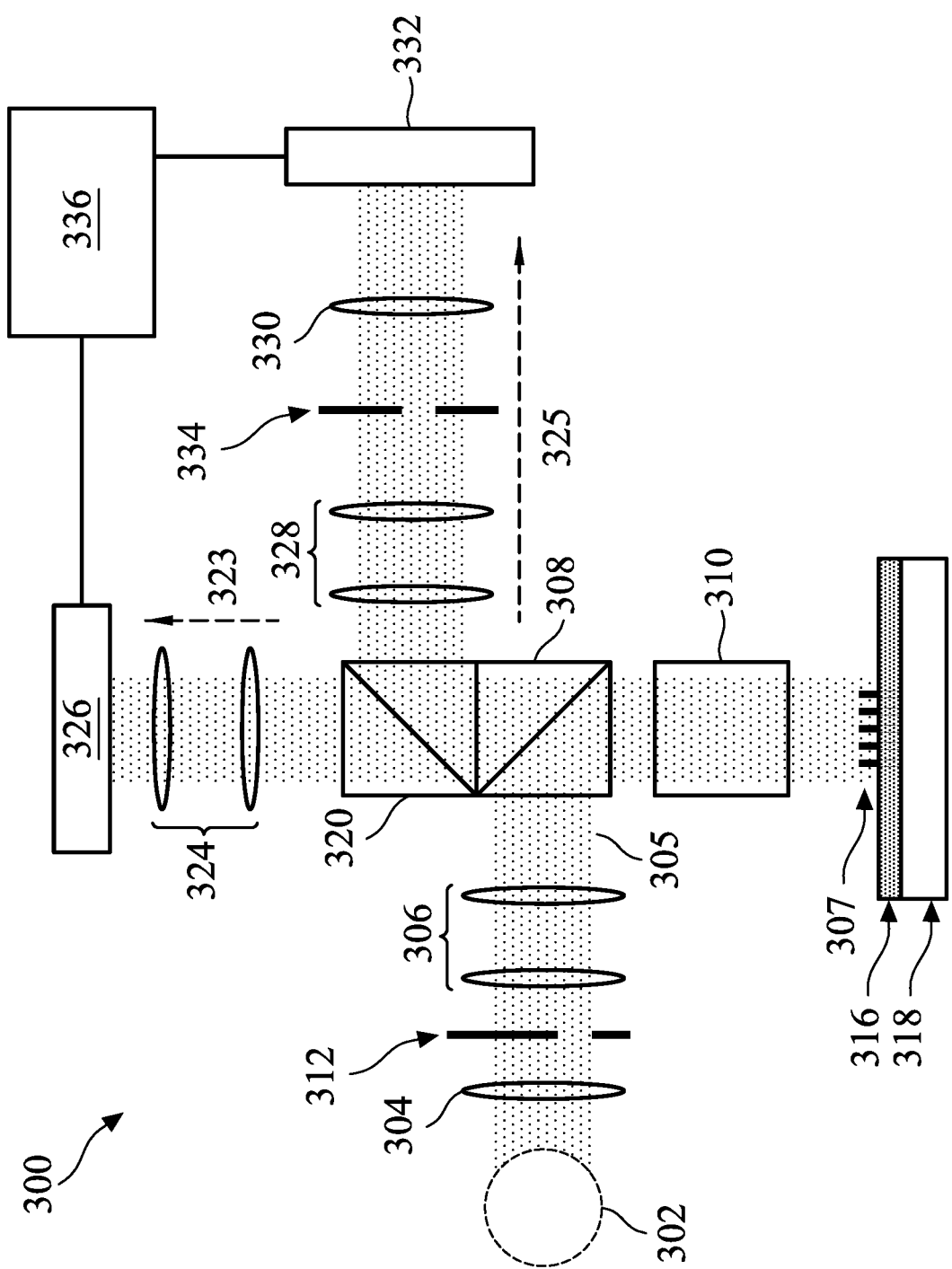
FIG. 3 provides a schematic view of a metrology apparatus including a scatterometer, according to some embodiments.

The method 100 then proceeds to block 104 where a metrology apparatus is configured with a first aperture plate to measure X-axis diffraction. In some embodiments, the metrology apparatus may include metrology apparatus 300, as shown in FIG. 3. In some cases, the metrology apparatus 300 may be integrated with a lithography system, such as described with reference to FIG. 5. Alternatively, the metrology apparatus 300 may be implemented as a stand-alone device. In various examples, the metrology apparatus 300 includes a scatterometer, which may be used to measure a pattern formed on a semiconductor substrate 316 (e.g., on substrate stage 318). Generally, a scatterometer may be used to measure an intensity of light diffracted as a function of incident angle and polarization. As such, the metrology apparatus 300 may be used to characterize surface roughness, defects, particle density, film thickness, critical dimensions, pattern overlay, etc. The metrology apparatus 300 includes a radiation source 302 that emits light 305. As shown in FIG. 3, the light 305 is directed to the semiconductor substrate 316 by way of lenses 304, 306, beam splitter 308, and objective lens 310. In various examples, an aperture plate 312 may be inserted between the lenses 304 and 306, for example, depending on a type of measurement being performed by the metrology apparatus 300. Additional details of the aperture plate 312, including various aperture plates that may be incorporated for use with the metrology apparatus 300, are provided below with respect to FIGS. 4A, 4B, and 4C. It is also noted that in various embodiments, the metrology apparatus 300 may be configurable such that the various aperture plates disclosed herein may be removed (manually or automatically) and a differently configured aperture plate placed in the metrology apparatus 300.

As part of an overlay measurement, the light 305 may be directed to a surface of the semiconductor substrate 316 and to one or more gratings 307 (e.g., stacked periodic structures) formed on the semiconductor substrate 316. In some embodiments, the gratings 307 may be as described above with reference to FIGS. 2A, 2B, and 2C, and the metrology apparatus 300 may be used to measure overlay errors between the gratings. In various examples, light 305 is diffracted by the gratings 307 and collected by the objective lens 310. In some embodiments, the zero-order ($0^{th}$ order) and/or the first order ($1^{st}$ order) diffracted signals are collected by the objective lens 310. The collected diffracted signals may then be directed to beam splitter 320, which divides the collected signals into two branches.

In a first branch 323, lenses 324 form a diffraction spectrum of the target (e.g., the one or more gratings 307) on a sensor 326. In some cases, the sensor 326 may include a charge-coupled device (CCD) or CMOS sensor, and may utilize the $0^{th}$ and/or the $1^{st}$ order diffraction signals to form the diffraction spectrum. In some embodiments, the first branch 323 and the sensor 326 may be used for overlay measurements. In a second branch 325, lenses 328, 330 form an image of the target (e.g., the one or more gratings 307) on a sensor 332. Like the sensor 326, the sensor 332 may include a CCD or CMOS sensor. In some examples, an aperture stop 334 is also disposed within the second branch 325 between the lenses 328 and 330, where the aperture stop 334 may function to block the $0^{th}$ order diffraction signal such that the image formed on the sensor 332 is formed only from the $1^{st}$ order diffraction signal. Thus, in various embodiments, the image formed on the sensor 332 may be referred to as a dark field image. In some embodiments, the images captured by the sensor 326 and the sensor 332 may be transmitted to an image processor and controller processing unit 336 for additional processing. While a particular example of the aperture stop 334 has been described, the above example is not meant to be limiting. In some cases, the aperture stop may include other configurations (e.g., on-axis, off-axis) that are designed to pass other orders of diffracted light.

In at least some embodiments, the image processor and controller processing unit 336 may be used to process images formed on the sensors 326, 332. In particular, the image processor 336 may identify separate images corresponding to distinct patterns of the gratings 307 (e.g., lines and/or segments), determine an intensity of each distinct image pattern, and an overlay error can be determined. In some embodiments, the image processor and controller processing unit 336 may first receive X- and Y-axis diffraction data, by a sequence of measurements using at least a first aperture plate (e.g., to measure X-axis diffraction) and a second aperture plate (e.g., to measure Y-axis diffraction), and then the image processor 336 may proceed to determine an overlay error. Additionally, in some embodiments, the image processor and controller processing unit 336 may first the receive X- and Y-axis diffraction data, as well as a combined X-Y signal, by a sequence of measurements using at least the first aperture plate (e.g., to measure X-axis diffraction), the second aperture plate (e.g., to measure Y-axis diffraction), and a third aperture plate (e.g., to measure X-axis and Y-axis diffraction simultaneously), which the image processor 336 may then use to determine an overlay error.

Figure 4C:
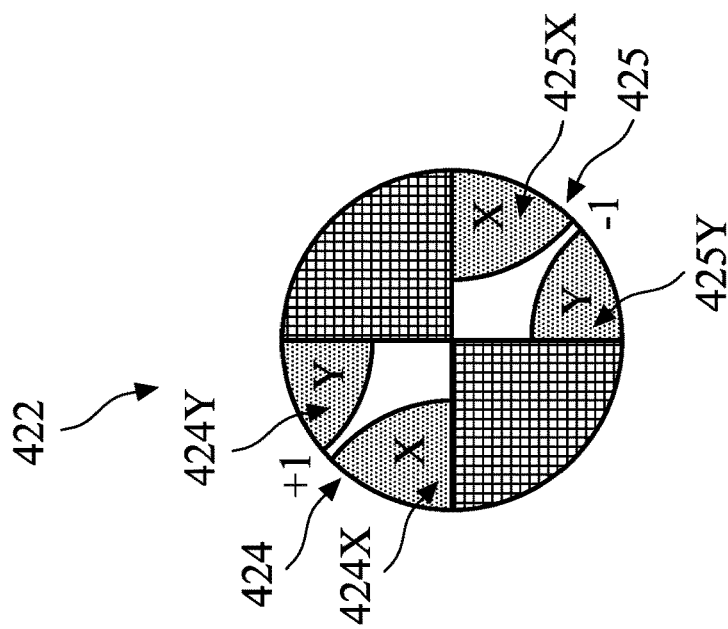
FIGS. 4A, 4B, and 4C provide examples of aperture plates that may be incorporated for use with the metrology apparatus of FIG. 3, in accordance with some embodiments.
Figure 4B:
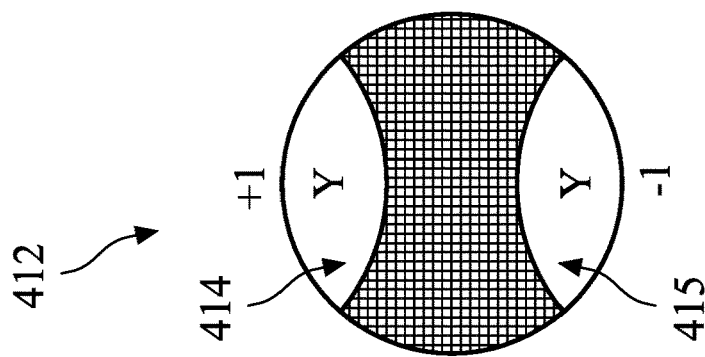
Figure 4A:
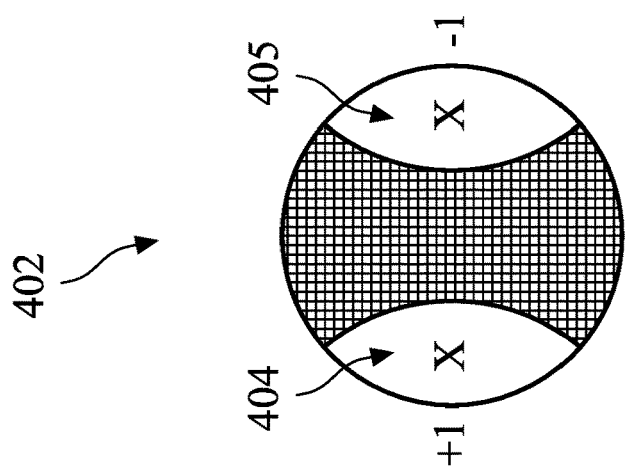

With reference now to FIG. 4A, illustrated therein is an exemplary embodiment of an aperture plate 402 that may be incorporated with the metrology apparatus 300 (e.g., in place of the aperture plate 312). The aperture plate 402 may be an aperture of a set of complementary apertures used in a diffraction-based overlay (DBO) method. In some embodiments, the aperture plate 402 is opaque to the light 305 emitted by the radiation source 302 such that light incident on the aperture plate 402 will be blocked from transmitting therethrough. In various embodiments, the aperture plate 402 may be made of a metal, metal alloy, or other proper material. In some cases, the aperture plate 402 may include one or more coating materials deposited thereon. In some embodiments, the aperture plate 402 has an annular shape defining a center to be aligned with the optical axis during a metrology process. A plurality of diametrical axes can be defined crossing the center (e.g., crossing perpendicular to the optical axis) and in the plane of the aperture plate 402.

As shown in FIG. 4A, the aperture plate 402 further includes a pair of radiation-transmitting regions defined in the aperture plate 402. In particular, a pair of radiation-transmitting regions 404, 405 are positioned in a first diametrical axis and on opposite sides of the optical axis. For example, the pair of radiation-transmitting regions 404, 405 may be mirror-images of one another on the optical axis. In an embodiment, the aperture plate 402 is used for collection of diffraction patterns along an X-axis, and may be referred to herein as a single pole 'X' aperture plate. Stated another way, in some embodiments, the aperture plate 402 may be used for X-oriented patterns, which in some cases may include a pattern of vertical lines. In some cases, and as graphically noted in FIG. 4A, the radiation-transmitting region 404 may be used to image (e.g. via the sensor 326) a +1 order diffraction signal, and the radiation-transmitting region 405 may be used to image a −1 order diffraction signal. In various embodiments, the radiation-transmitting regions 404, 405 may include transparent or translucent materials, an opening, and/or other suitable material. Additionally, as the pair of radiation-transmitting regions 404, 405 are disposed off-center with respect to the optical axis, the aperture plate 402 may be configured to provide off-axis illumination of the gratings 307. In some embodiments, the first aperture plate of block 104 may include the aperture plate 402. However, in some cases and depending on an alternative order of the steps of the method 100 and/or based on various implementations of the embodiments described herein, the first aperture plate of block 104 may equally include the aperture plate 412 or the aperture plate 422, described below.

Referring to FIG. 4B, illustrated therein is an exemplary embodiment of an aperture plate 412 that may be incorporated with the metrology apparatus 300 (e.g., in place of the aperture plate 312). The aperture plate 412 may be an aperture of a set of complementary apertures used in a diffraction-based overlay (DBO) method. In some embodiments, the aperture plates 402 and 412 are complementary aperture plates. For example, in an embodiment, the aperture plate 402 may be positioned in the metrology apparatus 300 and used for collection of diffraction patterns along an X-axis. Thereafter, the aperture plate 412 may be positioned in the metrology apparatus 300 and used for collection of diffraction patterns along a Y-axis. In some embodiments, the complementary aperture plates 402, 412 may be used for independent collection of X-axis and Y-axis diffraction data, mitigating the risk of X- and Y-signal crosstalk.

In some embodiments, the aperture plate 412 may be substantially similar to the aperture plate 402. However, as shown in FIG. 4B, the configuration of the radiation-transmitting regions may be different. For example, in the aperture plate 412 a pair of radiation-transmitting regions 414, 415 are positioned on a second diametrical axis and on opposite sides of the optical axis. In some embodiments, the second diametrical axis is substantially perpendicular to the first diametrical axis. For example, the pair of radiation-transmitting regions 414, 415 may be mirror-images of one another on the optical axis. In an embodiment, the aperture plate 412 is used for collection of diffraction patterns along a Y-axis, and may be referred to herein as a single pole 'Y' aperture plate. Stated another way, in some embodiments, the aperture plate 412 may be used for Y-oriented patterns, which in some cases may include a pattern of horizontal lines. In some cases, and as graphically noted in FIG. 4B, the radiation-transmitting region 414 may be used to image (e.g. via the sensor 326) a +1 order diffraction signal, and the radiation-transmitting region 415 may be used to image a −1 order diffraction signal. Additionally, as the pair of radiation-transmitting regions 414, 415 are disposed off-center with respect to the optical axis, the aperture plate 412 may be configured to provide off-axis illumination of the gratings 307. In some cases, the second diametrical axis is substantially perpendicular to the first diametrical axis, illustrated in FIG. 4A. Also, in some embodiments, both diametrical axes may be substantially perpendicular to the optical axis of the metrology apparatus 300. In some embodiments, the second aperture plate of block 108 of the method 100 may include the aperture plate 412. However, in some cases and depending on an alternative order of the steps of the method 100 and/or based on various implementations of the embodiments described herein, the second aperture plate may equally include the aperture plate 402 or the aperture plate 422.

With reference to FIG. 4C, illustrated therein is an exemplary embodiment of an aperture plate 422 that may be incorporated with the metrology apparatus 300 (e.g., in place of the aperture plate 312). In some embodiments, the aperture plate 422 includes an X-Y aperture plate that is designed to simultaneously collect diffraction patterns along both the X-axis and the Y-axis. As discussed above, and in some embodiments, the single pole 'X' and 'Y' aperture plates (e.g., aperture plates 402 and 412) may alone be used for diffraction pattern measurement. However, in some embodiments, the aperture plates 402 and 412 may be used in a complementary manner with the aperture plate 422. For example, in an embodiment, the aperture plate 402 may be positioned in the metrology apparatus 300 and used for collection of diffraction patterns along an X-axis. Thereafter, the aperture plate 412 may be positioned in the metrology apparatus 300 and used for collection of diffraction patterns along a Y-axis. Thereafter, the aperture plate 422 may be positioned in the metrology apparatus 300 and used for simultaneous collection of diffraction patterns along both the X-axis and the Y-axis. In some embodiments, the use of the complementary aperture plates 402, 412, together with the aperture plate 422, may be used to effectively mitigate the risk of X- and Y-signal crosstalk and improve diffraction image measurement integrity.

In some embodiments, the aperture plate 422 may be substantially similar to the aperture plates 402, 412. However, as shown in FIG. 4C, the configuration of the radiation-transmitting regions may be different. For example, in the aperture plate 422 a pair of radiation-transmitting regions 424, 425 are positioned on a third diametrical axis and on opposite sides of the optical axis. For example, the pair of radiation-transmitting regions 424, 425 may be mirror-images of one another on the optical axis. In an embodiment, the aperture plate 422 is used for collection of diffraction patterns along both an X-axis and a Y-axis, and may be referred to herein as an X-Y aperture plate (e.g., having two poles). In some cases, because the third diametrical axis is disposed at a diagonal (e.g., about a 45 degree angle) with respect to the first and second diametrical axes, each of the pair of radiation-transmitting regions 424, 425 are configured to simultaneously image an X-oriented pattern and a Y-oriented pattern. As illustrated in FIG. 4C, the radiation-transmitting region 424 may include an X-axis imaging portion 424X and a Y-axis imaging portion 424Y. Similarly, the radiation-transmitting region 425 may include an X-axis imaging portion 425X and a Y-axis imaging portion 425Y. In addition, and as also noted in FIG. 4C, the radiation-transmitting region 424 may be used to image (e.g. via the sensor 326) a +1 order diffraction signal of both an X- and Y-oriented pattern via the X-axis imaging portion 424X and a Y-axis imaging portion 424Y. Likewise, the radiation-transmitting region 425 may be used to image (e.g. via the sensor 326) a −1 order diffraction signal of both an X- and Y-oriented pattern via the X-axis imaging portion 425X and a Y-axis imaging portion 425Y. In some embodiments, the third diametrical axis may be substantially perpendicular to the optical axis of the metrology apparatus 300. In some embodiments, the aperture plate 422 may be either of the first or second aperture plates of the method 100. However, in some cases and depending on an alternative order of the steps of the method 100 and/or based on various implementations of the embodiments described herein, the aperture plate 422 may include a third aperture plate used in a complementary manner with the first and second aperture plates, as described above.

It is noted that configuration, size, open angles, and diametrical axes of the radiation-transmitting regions described above are merely exemplary and are not intended to be limiting in any manner. Moreover, the configuration, sizes, angles, quantity, or similar features of the radiation-transmitting regions may be varied to provide optimization of the metrology process being performed. Specifically, the configuration, sizes, angles or the like may be varied so as to optimize measurement of the overlay error and mitigate X- and Y-signal crosstalk. One of ordinary skill in the art would recognize the benefits of varying the configuration, size, or angles of the poles of the exemplary aperture plates, without departing from the scope of the present disclosure. In addition, variables such as the numerical aperture (NA), wavelength of radiation, physical properties (e.g., pitch, size) of pattern to be measured (e.g., gratings), and the like, would be recognized as applicable to the selection of the configuration, size, shape, or angle of poles.

The method 100 then proceeds to block 106 where an X-axis diffraction pattern corresponding to the first aperture plate is measured. By way of example, and in some embodiments, the first aperture plate includes the aperture plate 402. Thus, in some examples, the measured diffraction pattern may include X-axis oriented components of the gratings (e.g., the gratings 200, 210, 307). In some embodiments, the measured X-axis diffraction data may be transmitted to an image processor (e.g., the image processor 336) for further processing.

The method 100 then proceeds to block 108 where the metrology apparatus is configured with a second aperture plate to measure Y-axis diffraction. The metrology apparatus may be substantially similar to the metrology apparatus 300, described above. In some embodiments, the second aperture plate may include the aperture plate 412, described above, which may be used for collection of diffraction patterns along a Y-axis. However, in some cases and depending on an alternative order of the steps of the method 100 and/or based on various implementations of the embodiments described herein, the second aperture plate may equally include the aperture plate 402 or the aperture plate 422. In some embodiments, prior to configuring the metrology apparatus 300 with the second aperture plate, the first aperture plate may be removed from an optical path of the light 305.

The method 100 then proceeds to block 110 where a Y-axis diffraction pattern corresponding to the second aperture plate is measured. By way of example, and in some embodiments, the second aperture plate includes the aperture plate 412. Thus, in some examples, the measured diffraction pattern may include Y-axis oriented components of the gratings (e.g., the gratings 200, 210, 307). In some embodiments, the measured Y-axis diffraction data may be transmitted to an image processor (e.g., the image processor 336) for further processing. The method 100 then proceeds to block 112 where an overlay error of the overlay grating is determined. In some embodiments, after the image processor 336 receives the measured X- and Y-axis diffraction data (e.g., measured at blocks 106 and 110), then the image processor 336 may proceed to determine the overlay error.

In some embodiments, and as part of the method 100, the metrology apparatus may optionally be configured with a third aperture plate to measure a combined X-Y diffraction signal. For example, in some embodiments, the third aperture plate (e.g., the aperture plate 422) may be used for simultaneous collection of diffraction patterns along both the X-axis and the Y-axis. To be sure, in some cases and depending on an alternative order of the steps of the method 100 and/or based on various implementations of the embodiments described herein, the aperture plate 422 may be used as the first or second aperture plate, and either of the aperture plates 402 or 412 may be used as the third aperture plate. In some embodiments, prior to configuring the metrology apparatus 300 with the third aperture plate, the first or second aperture plate (if present) may be removed from an optical path of the light 305.

When configured with the third aperture plate, the method 100 may optionally include measurement of a combined X-Y diffraction pattern corresponding to the third aperture plate. Thus, in some examples, the measured diffraction pattern may include both X-axis and Y-axis oriented components of the gratings (e.g., the gratings 200, 210, 307). In some embodiments, the measured X-Y diffraction data may be transmitted to an image processor (e.g., the image processor 336) for further processing. In some embodiments, for example when the method 100 includes optional third aperture plate, and after the image processor 336 receives the measured X- and Y-axis diffraction data, as well as the measured X-Y diffraction data, then the image processor 336 may proceed to determine the overlay error.

Figure 5:
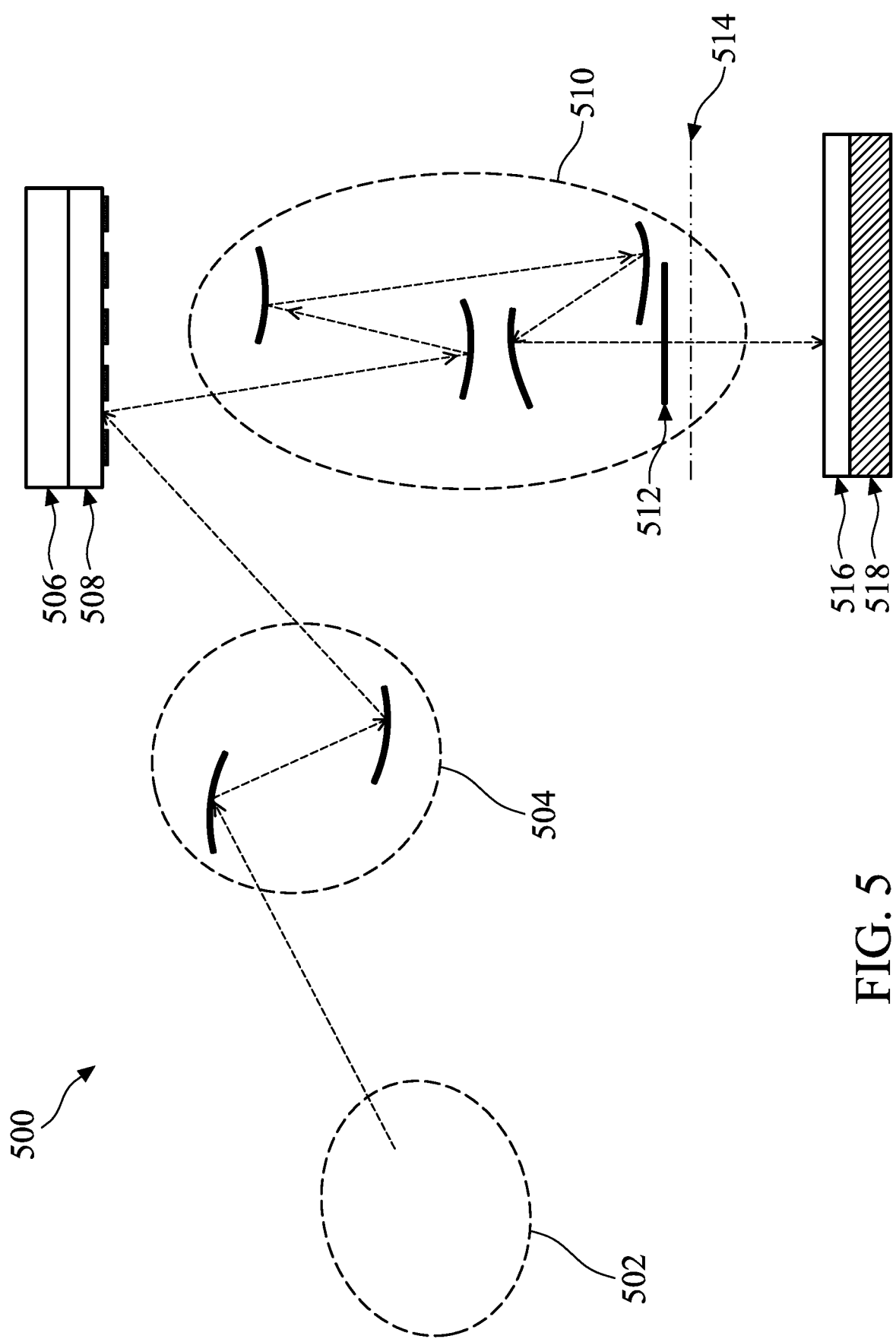
FIG. 5 is a schematic view of a lithography system, in accordance with some embodiments.

As previously noted, the metrology apparatus 300 described above may be integrated with a lithography system. By way of illustration, and with reference to FIG. 5, provided therein is a schematic view of an exemplary lithography system 500, in accordance with some embodiments. The lithography system 500 may also be generically referred to as a scanner that is operable to perform lithographic processes including exposure with a respective radiation source and in a particular exposure mode. In at least some of the present embodiments, the lithography system 500 includes an extreme ultraviolet (EUV) lithography system designed to expose a resist layer by EUV light. Inasmuch, in various embodiments, the resist layer includes a material sensitive to the EUV light (e.g., an EUV resist). The lithography system 500 of FIG. 5 includes a plurality of subsystems such as a radiation source 502, an illuminator 504, a mask stage 506 configured to receive a mask 508, projection optics 510, and a substrate stage 518 configured to receive a semiconductor substrate 516. A general description of the operation of the lithography system 500 may be given as follows: EUV light from the radiation source 502 is directed toward the illuminator 504 (which includes a set of reflective mirrors) and projected onto the reflective mask 508. A reflected mask image is directed toward the projection optics 510, which focuses the EUV light and projects the EUV light onto the semiconductor substrate 516 to expose an EUV resist layer deposited thereupon. Additionally, in various examples, each subsystem of the lithography system 500 may be housed in, and thus operate within, a high-vacuum environment, for example, to reduce atmospheric absorption of EUV light.

In the embodiments described herein, the radiation source 502 may be used to generate the EUV light. In some embodiments, the radiation source 502 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 502 generates EUV light with a wavelength centered at about 13.5 nm. Accordingly, the radiation source 502 may also be referred to as an EUV radiation source 502. In some embodiments, the radiation source 502 also includes a collector, which may be used to collect EUV light generated from the plasma source and to direct the EUV light toward imaging optics such as the illuminator 504.

As described above, light from the radiation source 502 is directed toward the illuminator 504. In some embodiments, the illuminator 504 may include reflective optics (e.g., for the EUV lithography system 500), such as a single mirror or a mirror system having multiple mirrors in order to direct light from the radiation source 502 onto the mask stage 506, and particularly to the mask 508 secured on the mask stage 506. In some examples, the illuminator 504 may include a zone plate, for example, to improve focus of the EUV light. In some embodiments, the illuminator 504 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 504 is operable to configure the mirrors (i.e., of the illuminator 504) to provide a desired illumination to the mask 508. In one example, the mirrors of the illuminator 504 are configurable to reflect EUV light to different illumination positions. In some embodiments, a stage prior to the illuminator 504 may additionally include other configurable mirrors that may be used to direct the EUV light to different illumination positions within the mirrors of the illuminator 504. In some embodiments, the illuminator 504 is configured to provide an on-axis illumination (ONI) to the mask 508. In some embodiments, the illuminator 504 is configured to provide an off-axis illumination (OAI) to the mask 508. It should be noted that the optics employed in the EUV lithography system 500, and in particular optics used for the illuminator 504 and the projection optics 510, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 500 also includes the mask stage 506 configured to secure the mask 508. Since the lithography system 500 may be housed in, and thus operate within, a high-vacuum environment, the mask stage 506 may include an electrostatic chuck (e-chuck) to secure the mask 508. As with the optics of the EUV lithography system 500, the mask 508 is also reflective. As illustrated in the example of FIG. 5, light is reflected from the mask 508 and directed towards the projection optics 510, which collects the EUV light reflected from the mask 508. By way of example, the EUV light collected by the projection optics 510 (reflected from the mask 508) carries an image of the pattern defined by the mask 508. In various embodiments, the projection optics 510 provides for imaging the pattern of the mask 508 onto the semiconductor substrate 516 secured on the substrate stage 518 of the lithography system 500. In particular, in various embodiments, the projection optics 510 focuses the collected EUV light and projects the EUV light onto the semiconductor substrate 516 to expose an EUV resist layer deposited on the semiconductor substrate 516. As described above, the projection optics 510 may include reflective optics, as used in EUV lithography systems such as the lithography system 500. In some embodiments, the illuminator 504 and the projection optics 510 are collectively referred to as an optical module of the lithography system 500.

In some embodiments, the lithography system 500 also includes a pupil phase modulator 512 to modulate an optical phase of the EUV light directed from the mask 508, such that the light has a phase distribution along a projection pupil plane 514. In some embodiments, the pupil phase modulator 512 includes a mechanism to tune the reflective mirrors of the projection optics 510 for phase modulation. For example, in some embodiments, the mirrors of the projection optics 510 are configurable to reflect the EUV light through the pupil phase modulator 512, thereby modulating the phase of the light through the projection optics 510. In some embodiments, the pupil phase modulator 512 utilizes a pupil filter placed on the projection pupil plane 514. By way of example, the pupil filter may be employed to filter out specific spatial frequency components of the EUV light reflected from the mask 508. In some embodiments, the pupil filter may serve as a phase pupil filter that modulates the phase distribution of the light directed through the projection optics 510.

As discussed above, the lithography system 500 also includes the substrate stage 518 to secure the semiconductor substrate 516 to be patterned. In various embodiments, the semiconductor substrate 516 includes a semiconductor wafer, such as a silicon wafer, germanium wafer, silicon-germanium wafer, III-V wafer, or other type of wafer as described above or as known in the art. The semiconductor substrate 516 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm². In the embodiments described herein, the various subsystems of the lithography system 500, including those described above, are integrated and are operable to perform lithography exposing processes including EUV lithography processes. To be sure, the lithography system 500 may further include other modules or subsystems which may be integrated with (or be coupled to) one or more of the subsystems or components described herein. Additionally, in some embodiments, the lithography system 500 may be used to pattern one or more of the gratings (e.g., the gratings 200, 210, 307) within a semiconductor layer and/or a resist layer.

The various embodiments described herein offer several advantages over the existing art. It will be understood that not all advantages have been necessarily discussed herein, no particular advantage is required for all embodiments, and other embodiments may offer different advantages. For example, embodiments discussed herein provide a method for performing DBO measurements utilizing apertures having a single pole for diffraction pattern measurement. For example, a single pole 'X' aperture plate is provided for collection of diffraction patterns along an X-axis, and a single pole 'Y' aperture plate is provided for collection of diffraction patterns along a Y-axis. In some cases, the single pole 'X' and 'Y' aperture plates may be used in a complementary manner with an 'X-Y' aperture plate that may be used to simultaneously collect diffraction patterns along both the X-axis and the Y-axis. By employing the single pole 'X' and 'Y' aperture plates, as disclosed herein, X-axis and Y-axis diffraction data, and thus overlay error, may be reliably collected even for aggressively scaled patterns. As a result, embodiments of the present disclosure provide for improved overlay error measurement, be mitigating X- and Y-signal crosstalk and providing excellent target (e.g., grating) design tolerance without having a limitation on segment pitch. Moreover, in at least some cases, embodiments of the present disclosure may be similarly used to improve optical critical dimension (OCD) measurement techniques, which in at least some current techniques, may suffer from X- and Y-signal crosstalk. Thus, embodiments of the present disclosure serve to overcome various shortcomings of at least some existing metrology measurement techniques including overlay error measurement techniques.

Thus, one of the embodiments of the present disclosure described a method that includes using a first aperture plate to measure X-axis diffraction of a composite grating. In some embodiments, the first aperture plate has a first pair of radiation-transmitting regions disposed along a first diametrical axis and on opposite sides of an optical axis that is aligned with a center of the first aperture plate. Thereafter, in some embodiments, a second aperture plate, which is complementary to the first aperture plate, is used to measure Y-axis diffraction of the composite grating. By way of example, the second aperture plate has a second pair of radiation-transmitting regions disposed along a second diametrical axis and on opposite sides of the optical axis. In some cases, the second diametrical axis is substantially perpendicular to the first diametrical axis.

In another of the embodiments, discussed is a method where a metrology apparatus is provided. By way of example, a first aperture plate is coupled to the metrology apparatus, where the first aperture plate has a first pair of radiation-transmitting regions disposed along a first diametrical axis and on opposite sides of an optical axis. In some embodiments, a first diffraction measurement is performed to form a first diffraction image on a sensor of the metrology apparatus, where the first diffraction image corresponds to X-axis oriented components of a composite grating. In some embodiments, a second aperture plate is then coupled to the metrology apparatus, where the second aperture plate has a second pair of radiation-transmitting regions disposed along a second diametrical axis and on opposite sides of an optical axis. In some embodiments, the second diametrical axis is perpendicular to the first diametrical axis. In various embodiments, a second diffraction measurement is performed to form a second diffraction image on the sensor of the metrology apparatus, where the second diffraction image corresponds to Y-axis oriented components of the composite grating.

In yet another of the embodiments, discussed is a method including providing a first metal aperture plate having a first pair of radiation-transmitting regions positioned along a first diametrical axis. Thereafter, in some embodiments, a radiation beam is directed through the first metal aperture plate to irradiate a composite grating disposed on a substrate, where the composite grating includes both vertically oriented features and horizontally oriented features, and where the radiation beam directed through the first metal aperture plate provides a first diffraction pattern corresponding to the horizontally oriented features. In some embodiments, the first metal aperture plate is automatically replaced with a second metal aperture plate having a second pair of radiation-transmitting regions positioned along a second diametrical axis, the second diametrical axis perpendicular to the first diametrical axis, where the first and second metal aperture plates are interchangeable in a metrology apparatus. In some examples, the radiation beam is directed through the second metal aperture plate to irradiate the composite grating, where the radiation beam directed through the second metal aperture plate provides a second diffraction pattern corresponding to the vertically oriented features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   using a first aperture plate to measure X-axis diffraction of a composite grating, wherein the first aperture plate has a first pair of radiation-transmitting regions disposed along a first diametrical axis and on opposite sides of an optical axis aligned with a center of the first aperture plate; and
   thereafter, using a second aperture plate, complementary to the first aperture plate, to measure Y-axis diffraction of the composite grating, wherein the second aperture plate has a second pair of radiation-transmitting regions disposed along a second diametrical axis and on opposite sides of the optical axis, and wherein the second diametrical axis is substantially perpendicular to the first diametrical axis.

2. The method of claim 1, further comprising:
   based on the measured X-axis diffraction and measured Y-axis diffraction of the composite grating, determining an overlay error of the composite grating.

3. The method of claim 1, wherein the composite grating includes one of a line-type grating and a segment-type grating.

4. The method of claim 3, wherein the composite grating includes the segment-type grating, wherein a segment critical dimension (CD) is equal to about 330 nm, wherein a segment pitch along the Y-axis is equal to about 500 nm, and wherein a main pitch along the X-axis is equal to about 600 nm.

5. The method of claim 1, further comprising:
   after measuring the Y-axis diffraction of the composite grating, using a third aperture plate, complementary to the first and second aperture plates, to simultaneously measure a combined X-axis and Y-axis diffraction of the composite grating, wherein the third aperture plate has a third pair of radiation-transmitting regions disposed along a third diametrical axis and on opposite sides of the optical axis, and wherein the third diametrical axis is oriented at about a 45 degree angle to each of the first diametrical axis and the second diametrical axis.

6. The method of claim 5, further comprising:
   based on the measured X-axis diffraction, the measured Y-axis diffraction, and the measured combined X-axis and Y-axis diffraction of the composite grating, determining an overlay error of the composite grating.

7. The method of claim 1, wherein the measured X-axis diffraction of the composite grating includes a +1 order diffraction signal and a −1 order diffraction signal, and wherein the +1 order diffraction signal and the −1 order diffraction signal are provided by the first pair of radiation-transmitting regions.

8. The method of claim 1, wherein the measured Y-axis diffraction of the composite grating includes a +1 order diffraction signal and a −1 order diffraction signal, and wherein the +1 order diffraction signal and the −1 order diffraction signal are provided by the second pair of radiation-transmitting regions.

9. The method of claim 5, wherein the measured combined X-axis and Y-axis diffraction of the composite grating includes a +1 order diffraction signal corresponding to each of an X-axis component and a Y-axis component, and a −1 order diffraction signal corresponding to each the X-axis component and the Y-axis component, and wherein the +1 order diffraction signal and the −1 order diffraction signal are provided by the third pair of radiation-transmitting regions.

10. A method, comprising:
    providing a metrology apparatus;
    coupling a first aperture plate to the metrology apparatus, wherein the first aperture plate has a first pair of radiation-transmitting regions disposed along a first diametrical axis and on opposite sides of an optical axis;
    performing a first diffraction measurement to form a first diffraction image on a sensor of the metrology apparatus, wherein the first diffraction image corresponds to X-axis oriented components of a composite grating;
    coupling a second aperture plate to the metrology apparatus, wherein the second aperture plate has a second pair of radiation-transmitting regions disposed along a second diametrical axis and on opposite sides of an optical axis, wherein the second diametrical axis is perpendicular to the first diametrical axis; and
    performing a second diffraction measurement to form a second diffraction image on the sensor of the metrology apparatus, wherein the second diffraction image corresponds to Y-axis oriented components of the composite grating.

11. The method of claim 10, further comprising:
    providing the aperture plate and the second aperture plate, wherein the first aperture plate and the second aperture plate include at least one of a metal and a metal alloy.

12. The method of claim 10, further comprising:
    coupling a third aperture plate to the metrology apparatus, wherein the third aperture plate has a third pair of radiation-transmitting regions disposed along a third diametrical axis and on opposite sides of an optical axis, wherein the third diametrical axis is oriented at about a 45 degree angle to each of the first diametrical axis and the second diametrical axis; and
    performing a third diffraction measurement to form a third diffraction image on the sensor of the metrology apparatus, wherein the third diffraction image corresponds to both the X-axis oriented components and the Y-axis oriented components of the composite grating.

13. The method of claim 10, further comprising:
    receiving, at an image processor of the metrology apparatus, the first diffraction image and the second diffraction image; and
    based on the first diffraction image and the second diffraction image, determining an overlay error of the composite grating.

14. The method of claim 10, wherein the composite grating includes a segment-type grating, and wherein a segment critical dimension (CD) is equal to about 330 nm, wherein a segment pitch along the Y-axis is equal to about 500 nm, and wherein a main pitch along the X-axis is equal to about 600 nm.

15. The method of claim 10, wherein the first diffraction image and the second diffraction image are used as part of an optical critical dimension (OCD) measurement.

16. A method, comprising:
providing a first metal aperture plate having a first pair of radiation-transmitting regions positioned along a first diametrical axis;
directing a radiation beam through the first metal aperture plate to irradiate a composite grating disposed on a substrate, wherein the composite grating includes both vertically oriented features and horizontally oriented features, and wherein the radiation beam directed through the first metal aperture plate provides a first diffraction pattern corresponding to the horizontally oriented features;
replacing the first metal aperture plate with a second metal aperture plate having a second pair of radiation-transmitting regions positioned along a second diametrical axis, the second diametrical axis perpendicular to the first diametrical axis, wherein the first and second metal aperture plates are interchangeable in a metrology apparatus; and
directing the radiation beam through the second metal aperture plate to irradiate the composite grating, wherein the radiation beam directed through the second metal aperture plate provides a second diffraction pattern corresponding to the vertically oriented features.

17. The method of claim 16, wherein the composite grating includes at least two gratings formed in different layers of the substrate, and wherein the at least two gratings are nominally aligned to each other.

18. The method of claim 17, further comprising:
based on the first diffraction pattern and the second diffraction pattern, determining an overlay error between the at least two gratings.

19. The method of claim 16, wherein the first diffraction pattern includes X-axis diffraction data, and wherein the second diffraction pattern includes Y-axis diffraction data.

20. The method of claim 16, further comprising:
replacing the second metal aperture plate with a third metal aperture plate having a third pair of radiation-transmitting regions positioned along a third diametrical axis, the third diametrical axis oriented at about a 45 degree angle to each of the first diametrical axis and the second diametrical axis, wherein the first, second, and third metal aperture plates are interchangeable in the metrology apparatus; and
directing the radiation beam through the third metal aperture plate to irradiate the composite grating, wherein the radiation beam directed through the third metal aperture plate provides a third diffraction pattern corresponding to both the horizontally oriented features and the vertically oriented features.

* * * * *